US012183821B2

(12) United States Patent
Choi et al.

(10) Patent No.: US 12,183,821 B2
(45) Date of Patent: Dec. 31, 2024

(54) SINGLE TRANSISTOR WITH DOUBLE GATE STRUCTURE FOR ADJUSTABLE FIRING THRESHOLD VOLTAGE, AND NEUROMORPHIC SYSTEM USING THE SAME

(71) Applicant: Korea Advanced Institute of Science and Technology, Daejeon (KR)

(72) Inventors: Yang-Kyu Choi, Daejeon (KR); Joon-Kyu Han, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 391 days.

(21) Appl. No.: 17/346,372

(22) Filed: Jun. 14, 2021

(65) Prior Publication Data

US 2021/0391462 A1 Dec. 16, 2021

(30) Foreign Application Priority Data

Jun. 15, 2020 (KR) .................. 10-2020-0072123
Nov. 24, 2020 (KR) .................. 10-2020-0158523

(51) Int. Cl.
*H01L 29/78* (2006.01)
*G06N 3/063* (2023.01)
*H01L 29/45* (2006.01)

(52) U.S. Cl.
CPC .......... *H01L 29/7831* (2013.01); *G06N 3/063* (2013.01); *H01L 29/458* (2013.01); *H01L 29/7841* (2013.01)

(58) Field of Classification Search
CPC .......... G06N 3/063; G06N 3/049; G06N 3/04; G06N 3/088; G06N 3/065; G06N 3/084;

(Continued)

(56) References Cited

U.S. PATENT DOCUMENTS 9,087,689 B1 * 7/2015 Tran .................. H01L 27/0688
9,165,242 B2 * 10/2015 Park ........................ G06N 3/02

(Continued)

FOREIGN PATENT DOCUMENTS

KR    10-2014-0088658 A    7/2014

OTHER PUBLICATIONS

Ueda, et al., Back-Propagation Operation for Analog Neural Network Hardware with Synapse Components Having Hysteresis Characteristics, PLOS ONE, 9, 11, e112659, 1-10 (Year: 2014).*
Masahara, et al., Demonstration of Asymmetric Gate-Oxide Thickness Four-Terminal FinFETs Having Flexible Threshold Voltage and Good Subthreshold Slope, IEEE Electron Device Letters, 28, 3, 217-219 (Year: 2007).*

*Primary Examiner* — Mouloucoulaye Inoussa
(74) *Attorney, Agent, or Firm* — Occhiuti & Rohlicek LLP

(57) ABSTRACT

Disclosed is a single transistor with a double gate structure for an adjustable firing threshold voltage and a neuromorphic system using the same. A single transistor neuron with a double gate structure according to an example embodiment includes a barrier material layer formed on a semiconductor substrate and comprising a hole barrier material or an electron barrier material; a floating body layer formed on the barrier material layer; a source and a drain formed at both sides of the floating body layer, respectively; a driving gate formed at a first side of the floating body layer without contacting the source and the drain; a control gate formed at a second side of the floating body layer without contacting the source and the drain; and a gate insulating film formed between the floating body layer and the driving gate and between the floating body layer and the control gate.

17 Claims, 6 Drawing Sheets

(58) Field of Classification Search
CPC ..... G06N 3/02; H01L 29/7841; H01L 29/458; H01L 29/7831; H01L 29/518; H01L 29/513; H01L 28/65; H01L 27/092; H01L 29/4958; H01L 29/42324; H01L 29/788; H01L 29/517; H01L 29/42332; H01L 29/1083; H01L 29/792; H01L 29/42348; H01L 29/42344; H01L 27/0688; H01L 29/7408; H10N 70/841; H10N 70/026; H10N 70/883; H10N 70/245; H10N 70/8416; H10N 70/8833; H10N 70/826; H10N 25/77; G11C 13/0007; G11C 13/0002; G11C 16/10; G11C 16/14; G11C 16/0466; G11C 16/12; G11C 2213/15; G11C 2213/72; G11C 2213/74; G11C 11/408; H03K 2217/0018; H03K 17/165; H03K 19/00346; H03K 17/161; H03K 19/00369; H03K 17/145; H04N 25/77; H10B 10/12

See application file for complete search history.

(56) References Cited

U.S. PATENT DOCUMENTS

| | | | |
|---|---|---|---|
| 10,425,077 B1* | 9/2019 | Spalding, Jr. | H03K 17/0822 |
| 11,081,595 B1* | 8/2021 | Sung | H01L 29/7887 |
| 11,322,613 B2* | 5/2022 | Choi | H01L 29/0676 |
| 2010/0110774 A1* | 5/2010 | Ouchi | H10B 10/12 |
| | | | 365/189.09 |
| 2017/0352750 A1* | 12/2017 | Lee | H01L 29/40117 |
| 2018/0083212 A1* | 3/2018 | Yoon | H10K 10/468 |
| 2019/0171933 A1* | 6/2019 | Lee | G06N 3/065 |
| 2019/0267382 A1* | 8/2019 | Widjaja | G11C 11/408 |
| 2019/0303744 A1* | 10/2019 | Yang | H01L 29/518 |
| 2020/0019835 A1* | 1/2020 | Park | G06N 3/063 |
| 2020/0045098 A1* | 2/2020 | Banister | G06F 16/2237 |
| 2021/0097380 A1* | 4/2021 | Choi | H10B 43/35 |
| 2021/0098611 A1* | 4/2021 | Hersam | G11C 13/0007 |
| 2021/0150320 A1* | 5/2021 | Kim | H01L 29/7408 |

* cited by examiner

SINGLE TRANSISTOR WITH DOUBLE GATE STRUCTURE FOR ADJUSTABLE FIRING THRESHOLD VOLTAGE, AND NEUROMORPHIC SYSTEM USING THE SAME

CROSS-REFERENCE TO RELATED APPLICATION

This application claims the priority benefit of Korean Patent Application No. 10-2020-0072123, filed on Jun. 15, 2020, and Korean Patent Application No. 10-2020-0158523, filed on Nov. 24, 2020, in the Korean Intellectual Property Office, the disclosure of which is incorporated herein by reference.

BACKGROUND

1. Field of the Invention

The following description of example embodiments relates to a single transistor with a double gate structure for an adjustable firing threshold voltage and a neuromorphic system using the same, and more particularly, to a single transistor neuron with a double gate structure capable of adjusting a firing threshold voltage of a neuron through a voltage applied to a control gage in a double gate transistor including independently separate two gates, for example, a driving gate and the control gate, an operation method thereof, and a neuromorphic system using the same.

2. Description of the Related Art

In the era of $4^{th}$ industrial revolution, research on an artificial intelligence (AI) system is being actively conducted. Here, a neuromorphic computing system that deviates from an existing von Neumann scheme consuming a large amount of energy is in the spotlight.

Neuromorphic computing refers to a scheme of implementing an AI operation by mimicking the human brain in a hardware manner While the human brain performs a very complex function, the brain consumes only 20 watts of energy. Neuromorphic computing may mimic a structure of the human brain itself and may perform an operation, inference, cognitive capability, and data processing capability superior to existing computing, with ultra-low power.

In particular, a spiking neural network (SNN) called a $3^{rd}$ generation (3G) artificial neural network model in neuromorphic computing refers to a neural network model based on a biological learning method and signal transmission of the biological brain and may significantly reduce energy consumption. Accordingly, related research is being actively conducted. Among hardware components to implement the SNN, a neuron is configured as an integrate-and-fire neuron that receives a current signal from a previous synapse and fires if the received signal reaches a certain level or more and transmits a voltage signal to a subsequent synapse. For such a neuron that operates as above, a complex circuit including a capacitor, an integrator, a comparator, and a reset circuit is used. However, the degree of integration of neurons needs to be enhanced in that the actual human brain has 100 billion neurons.

Accordingly, a single transistor neuron using a single transistor latch phenomenon is proposed. The corresponding single transistor neuron may increase the degree of integration up to 6 $F^2$ in a horizontal structure and may increase the degree of integration up to 4 $F^2$ in a vertical structure.

Meanwhile, a firing threshold voltage of a neuron is a very important indicator since it determines a number of firings of a neuron. A firing threshold voltage is adjusted to maintain homeostasis of a neuron from system instability. In particular, a synapse that is another component of neuromorphic hardware is generally implemented as a memristor. Here, the memristor is also known to have significant instability according to a process and an operation. If an electrical conductivity of a synapse is abnormally small or large, a desired number of firings of a neuron may not be acquired. The firing threshold voltage may be adjusted to enhance the instability. For example, a number of firings of a neuron may be maintained regardless of a non-ideal characteristic of a synapse by decreasing a firing threshold voltage value if small current is input to the neuron due to an abnormally small electrical conductivity of the synapse and by increasing the firing threshold voltage value if large current is input to the neuron due to an abnormally large electrical conductivity of the synapse. In this aspect, there is a need for a single transistor neuron for an adjustable firing threshold voltage.

SUMMARY

Example embodiments provide a single transistor neuron with a double gate structure capable of adjusting a firing threshold voltage of a neuron through a voltage applied to a control gage in a double gate transistor including independently separate two gates, for example, a driving gate and the control gate, an operation method thereof, and a neuromorphic system using the same. With the above structure and method of the example embodiments, a neuron configured as a complex circuit on an existing neuromorphic chip may be implemented as a single device and homeostasis of the neuron may be maintained from external instability by adjusting a firing threshold voltage of the neuron as necessary.

However, technical subjects to be solved herein are not limited to the aforementioned subject and may be variously expanded without departing from the technical spirit and scope of the disclosure.

According to an aspect of an example embodiment, there is provided a single transistor neuron with a double gate structure, the single transistor neuron including a barrier material layer formed on a semiconductor substrate and including a hole barrier material or an electron barrier material; a floating body layer formed on the barrier material layer; a source and a drain formed at both sides of the floating body layer, respectively; a driving gate formed at a first side of the floating body layer without contacting the source and the drain; a control gate formed at a second side of the floating body layer without contacting the source and the drain; and a gate insulating film formed between the floating body layer and the driving gate and between the floating body layer and the control gate.

The barrier material layer may be formed using one of buried oxide, a buried n-well in the case of a p-type body, a buried p-well in the case of an n-type body, buried SiC, and buried SiGe.

The floating body layer may accumulate holes or electrons and may be formed using one of silicon, germanium, silicon germanium, and group III-V compound semiconductor.

The semiconductor substrate may be actable as a back gate.

The source and the drain may be formed using one of n-type silicon, p-type silicon, and metal silicide.

The source and the drain formed using the n-type silicon or the p-type silicon may be formed using at least one of diffusion, solid-phase diffusion, epitaxial growth, selective epitaxial growth, ion implantation, and subsequent annealing treatment.

The source and the drain formed using the metal silicide may include the metal silicide formed using one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), lead (Pb), and iridium (Ir), and may enhance a junction using dopant segregation.

The driving gate and the control gate may be formed using one of n-type polysilicon, p-type polysilicon, aluminum (Al), molybdenum (Mo), chromium (Cr), palladium (Pd), platinum (Pt), nickel (Ni), titanium (Ti), tantalum (Ta), tungsten (W), silver (Ag), titanium nitride (TiN), tantalum nitride (TaN), and any combination thereof.

The gate insulating film may be formed using one of silicon oxide, silicon nitride, silicon oxynitride, aluminum oxide, hafnium oxide, hafnium oxynitride, zinc oxide, zirconium oxide, hafnium zirconium oxide (HZO), and any combination thereof.

The driving gate and the control gate may be independently separate from each other and formable into different types, and the gate insulating film in contact with the driving gate and the gate insulating film in contact with the control gate are formable using different types, electric constants, and thicknesses.

The single transistor neuron with the double gate structure may integrate a signal when a current signal is applied to the source or the drain, and may output a voltage signal in a form of a spike from the source or the drain if the integrated signal reaches a predetermined level or more.

The single transistor neuron with the double gate structure may implement an inhibitory function of inhibiting a spike action of a neuron by inputting an inhibitory signal to the driving gate.

The single transistor neuron with the double gate structure may implement a homeostasis function of a neuron by changing a voltage that is applied to the control gate and thereby adjusting a firing threshold voltage of the neuron.

According to an aspect of an example embodiment, there is provided an operation method of a single transistor neuron with a double gate structure including a driving gate and a control gate independently separate from each other, the method including inputting a current signal from a previous synaptic device to a source or a drain; storing charge by the current signal in a transistor; outputting a voltage signal in a form of a spike when a source voltage or a drain voltage increasing according to the stored charge reaches a firing threshold voltage or more; and adjusting the firing threshold voltage through the control gate if a frequency of the output voltage signal deviates from a preset normal range.

According to an aspect of an example embodiment, there is provided a neuromorphic system including a single transistor neuron with a double gate structure including a driving gate and a control gate independently separate from each other, wherein the single transistor neuron is capable of adjusting a firing threshold voltage through the control gate.

The neuromorphic system may include at least one additional component among a resistance, a capacitor, another transistor, and an inverter in addition to the single transistor neuron.

The neuromorphic system may include any one synaptic device among a resistive random access memory (RRAM), a memristor, a charge trap flash memory, a phase change material (PCM), and a ferroelectric RAM (FeRAM) in addition to the single transistor neuron.

According to an aspect of an example embodiment, there is provided a single transistor neuron with a double gate structure, the single transistor neuron including a barrier material layer formed on a semiconductor substrate and including a hole barrier material or an electron barrier material; a floating body layer formed on the barrier material layer; a source and a drain formed at both sides of the floating body layer, respectively; a driving gate formed at a first side of the floating body layer without contacting the source and the drain; a control gate formed at a second side of the floating body layer without contacting the source and the drain; and a gate insulating film formed between the floating body layer and the driving gate and between the floating body layer and the control gate. The single transistor neuron with the double gate structure implements an inhibitory function of inhibiting a spike action of a neuron by inputting an inhibitory signal to the driving gate.

According to some example embodiments, in a double gate structure including independently separate two gates, for example, a driving gate and a control gate, it is possible to adjust a firing threshold voltage of a neuron through a voltage applied to the control gate and to implement a homeostasis function of the neuron accordingly.

That is, with the structure and method of the example embodiments, a neuron configured as a complex circuit on an existing neuromorphic chip may be implemented as a single device and homeostasis of the neuron may be maintained from external instability by adjusting a firing threshold voltage of the neuron as necessary.

According to some example embodiments, since charge is stored inside a transistor, an external capacitor is not required, which differs from an existing circuit-based neuron. If an amount of stored charge reaches a predetermined threshold or more, the stored charge is automatically removed. Therefore, an existing comparator circuit or a potential adjusting circuit is not required. Accordingly, it is possible to significantly enhance the degree of integration of a neuron on a neuromorphic chip.

However, the effect of example embodiments is not limited to the aforementioned effect and may be variously expanded without departing from the technical spirit and scope of the disclosure.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
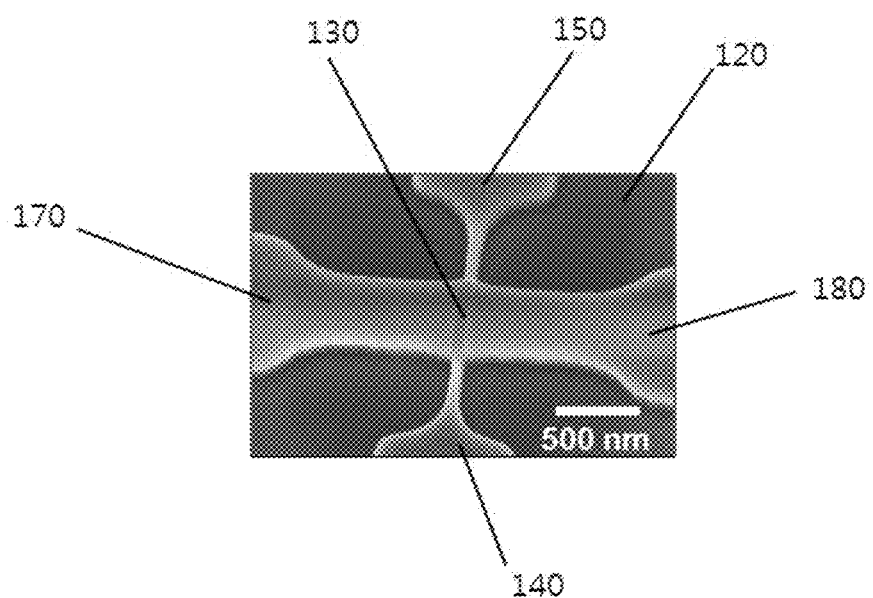
FIG. 1 illustrates a scanning electron microscope (SEM) image of a single transistor neuron with a double gate structure according to an example embodiment.

Aspects and features of the disclosure and methods to achieve the same may become clear with reference to the accompanying drawings and the following example embodiments. The example embodiments, however, may be embodied in various different forms, and should not be construed as being limited to only the illustrated embodiments. Rather, the illustrated embodiments are provided as examples so that this disclosure will be thorough and complete, and are defined by the scope of the claims.

The terms used herein are to describe the example embodiments and not to limit the disclosure. As used herein, the singular forms "a," "an," and "the," are intended to include the plural forms as well, unless the context clearly indicates otherwise. It will be further understood that the terms "comprises" and/or "comprising," when used in this specification, specify the presence of stated features, steps, operations, and/or components, but do not preclude the presence or addition of one or more other features, steps, operations, elements, components, and/or groups, thereof.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Hereinafter, the example embodiments will be described in more detail with reference to the accompanying drawings. Like reference numerals refer to like elements through and further description related thereto is omitted.

The example embodiments relate to implementing a homeostasis function of a neuron by adjusting a firing threshold voltage of the neuron through a voltage applied to a control gage in a double gate transistor including independently separate two gates, for example, a driving gate and the control gate.

Figure 2A:
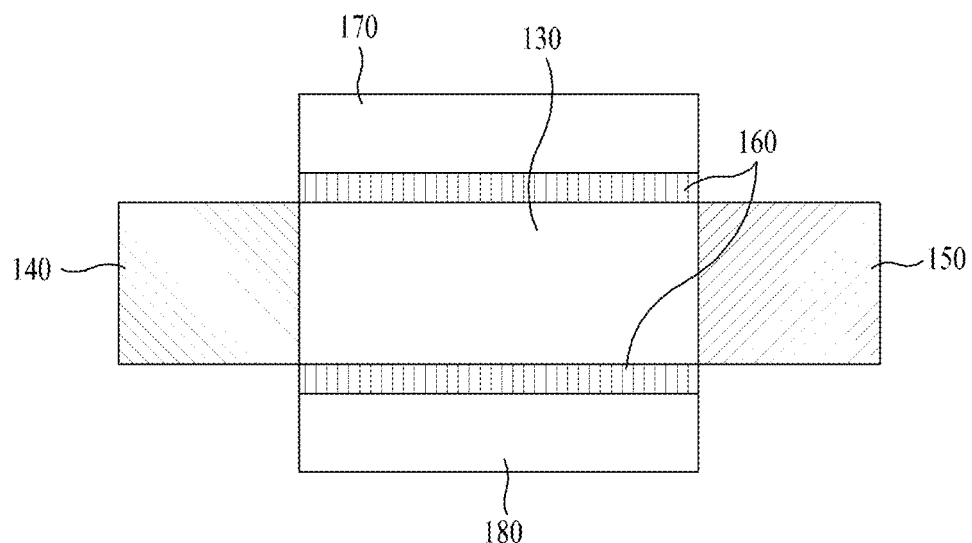
FIG. 2A is a plan view and FIG. 2B is a cross-sectional view of a single transistor neuron with a double gate structure according to an example embodiment.
Figure 2B:
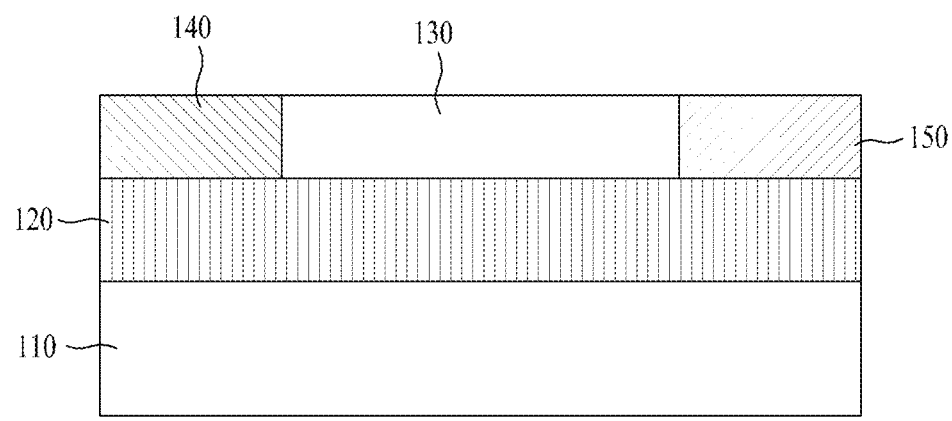

FIG. 1 illustrates a scanning electron microscope (SEM) image of a single transistor neuron with a double gate structure according to an example embodiment, and FIG. 2A is a plan view and FIG. 2B is a cross-sectional view of a single transistor neuron with a double gate structure according to an example embodiment.

Referring to FIGS. 1 and FIGS. 2A and 2B, a single transistor with a double gate structure according to an example embodiment includes a semiconductor substrate 110, a barrier material layer 120 including a hole barrier material or an electron barrier material, a floating body layer 130, a source 140 and a drain 150, a gate insulating film 160, a driving gate 170, and a control gate 180.

The semiconductor substrate 110 refers to a single crystal semiconductor substrate, and may be formed as one of a silicon substrate, a silicon germanium substrate, a tensile silicon germanium substrate, and a silicon carbide substrate.

The semiconductor substrate 110 may act as a back gate that applies a voltage bias. The barrier material layer 120 including the hole barrier material or the electron barrier material and the floating body layer 130 may be sequentially provided on the semiconductor substrate 110.

The barrier material layer 120 may be formed using one of buried oxide, a buried n-well in the case of a p-type body, a buried p-well in the case of an n-type body, buried SiC, and buried SiGe.

The floating body layer 130 may be formed on the barrier material layer 120 and may be formed using one of silicon, germanium, silicon germanium, and group III-V compound semiconductor. Also, holes or electrons generated by impact ionization are accumulated in the floating body layer 130, thereby enabling a neuron operation.

The source 140 and the drain 150 are formed at both sides of the floating body layer 130, respectively.

The source 140 and the drain 150 may be formed using one of n-type silicon, p-type silicon, and metal silicide. Here, the source 140 and the drain 150 may have a type different from that of the floating body layer 130. For example, if the source 140 and the drain 150 are p-type, the floating body layer 130 may be n-type. If the source 140 and the drain 150 are n-type, the floating body layer 130 may be p-type.

The source 140 and the drain 150 using n-type silicon or p-type silicon may be formed using at least one of diffusion, solid-phase diffusion, epitaxial growth, selective epitaxial growth, ion implantation, and subsequent annealing treatment.

The source 140 and the drain 150 formed using the metal silicide may include the metal silicide formed using one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), lead (Pb), and iridium (Ir), and may enhance a junction using dopant segregation.

In the single transistor, if a current signal is input from a previous synapse to the source 140 or the drain 150, a voltage signal in a form of a spike may be output.

The driving gate 170 and the control gate 180 are formed at both sides of the floating body layer 130, respectively, without contacting the source 140 and the drain 150. That is, the driving gate 170 is formed at a first side of the floating body layer 130 without contacting the source 140 and the drain 150, and the control gate 180 is formed at a second side of the floating body layer 130 without contacting the source 140 and the drain 150.

The driving gate 170 and the control gate 180 may be formed using one of n-type polysilicon, p-type polysilicon, and a metal. The metal may include one of aluminum (Al), molybdenum (Mo), chromium (Cr), palladium (Pd), platinum (Pt), nickel (Ni), titanium (Ti), tantalum (Ta), tungsten (W), silver (Ag), titanium nitride (TiN), tantalum nitride (TaN), and any combination thereof.

The driving gate 170 receives an inhibitory signal and enables an inhibitory function of a neuron. The inhibitory function is to inhibit spiking of a neuron regardless of whether a current signal is input and fires only a necessary neuron, thereby reducing energy consumption of a neuromorphic system. A corresponding gate may be referred to as a driving gate in that the gate determines a driving scheme about whether to activate or inhibit activity of a neuron.

The control gate 180 enables a homeostasis function of a neuron by adjusting a firing threshold voltage of the neuron.

That is, if an abnormal spiking frequency is output due to an abnormally small or large conductivity of a synapse, the spiking frequency may be made constant by adjusting a firing threshold voltage of the neuron, thereby enhancing stability of the neuromorphic system. A corresponding gate may be referred to as a control gate in that the gate adjusts the firing threshold voltage.

The gate insulating film 160 refers to insulating the floating body layer 130 from the driving gate 170 and the control gate 180, and may be formed using one of silicon oxide, silicon nitride, silicon oxynitride, aluminum oxide, hafnium oxide, hafnium oxynitride, zinc oxide, zirconium oxide, hafnium zirconium oxide (HZO), and any combination thereof.

A charge storage layer may be present in the gate insulating film 160. The corresponding charge storage layer may be formed using one of polysilicon, amorphous silicon, metal oxide, silicon nitride, silicon nanocrystal, and metal oxide nanocrystal.

The driving gate 170 and the control gate 180 may be formed into different types and the gate insulating film 160 in contact with the driving gate 170 and the gate insulating film in contact 160 with the control gate 180 may be formable using different types, electric constants, and thicknesses.

A single transistor neuron with a double gate structure according to an example embodiment may perform a neuron operation by integrating a signal when a current signal is applied from a previous synaptic device to the source 140 or the drain 150, and by outputting a voltage signal in a form of a spike if a voltage of the source 140 or a voltage of the drain 150 increasing accordingly reaches a firing threshold voltage or more. Also, energy consumption of the neuromorphic system may be reduced by enabling the inhibitory function through the driving gate 170 and stability of the neuromorphic system may be enhanced by enabling the homeostasis through the control gate 180.

Figure 3:
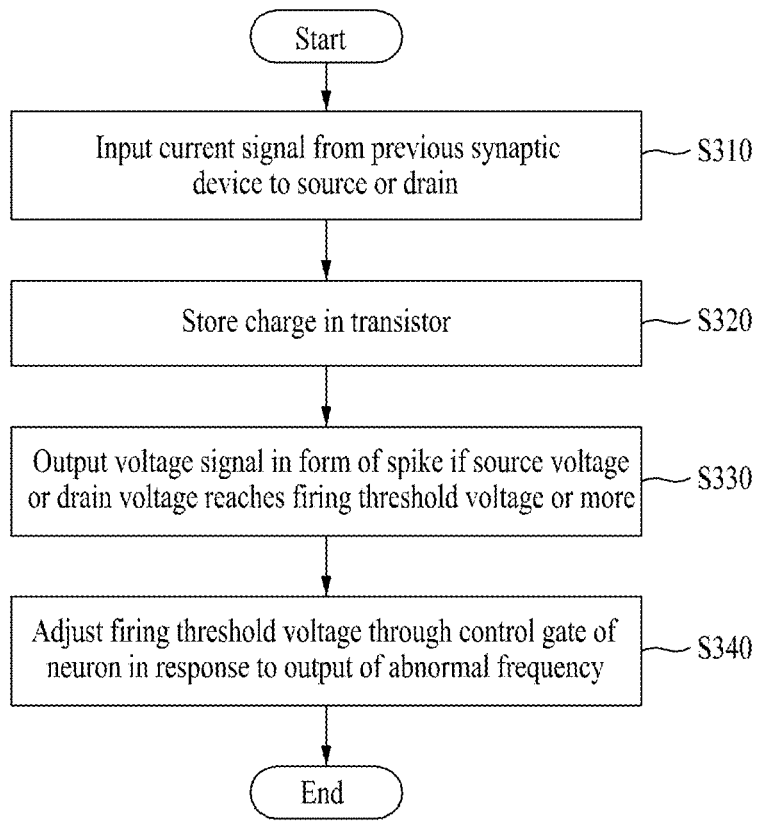
FIG. 3 is a flowchart illustrating an operation method of a single transistor neuron with a double gate structure according to an example embodiment.

FIG. 3 is a flowchart illustrating an operation method of a single transistor neuron with a double gate structure according to an example embodiment. The method of FIG. 3 may be performed by the single transistor neuron with the double gate structure according to the example embodiment of FIGS. 1 and 2A and 2B.

Referring to FIG. 3, in the operation method of the single transistor neuron with the double gate structure, a current signal is input from a previous synaptic device to a source or a drain in operation S310.

In operation S320, charge by the current signal is stored in a transistor. In operation S330, if an amount of the stored charge reaches a threshold or more, that is, if an increased source voltage or drain voltage reaches a firing threshold voltage or more, a voltage signal in a form of a spike is output.

Here, in the case of outputting an abnormal spiking frequency, for example, if a frequency of the output voltage signal deviates from a preset normal range, the firing threshold voltage is adjusted by adjusting a voltage applied to a control gate in operation S340.

Accordingly, when the current signal is input from the previous synaptic device to the source or the drain in operation S310, a normal spiking frequency may be output, which represents a homeostasis function of a neuron.

Also, in the case of performing a neuron operation in the aforementioned manner, the single transistor neuron with the double gate structure according to the example embodiment may further include at least one additional component among a resistance, a capacitor, another transistor, and an inverter.

Also, in the case of performing a neuron operation in the aforementioned manner, the single transistor neuron with the double gate structure according to the example embodiment may include any one synaptic device among a resistive random access memory (RRAM), a memristor, a charge trap flash memory, a phase change material (PCM), and a ferroelectric RAM (FeRAM) in a limited area of an input and output end of a single transistor that performs the neuron operation.

Figure 4:
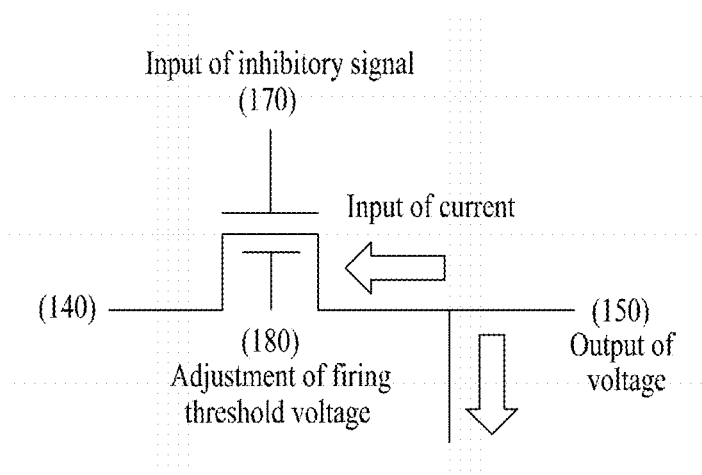
FIG. 4 illustrates an example of describing an operation method of a single transistor neuron with a double gate structure according to an example embodiment.

FIG. 4 illustrates an example of describing an operation method of a single transistor neuron with a double gate structure according to an example embodiment.

Referring to FIG. 4, the single transistor neuron receives a current signal using the source 140 or the drain 150 and, if a source voltage or a drain voltage by an integrated signal reaches a firing threshold voltage or more, outputs a voltage signal in a form of a spike. Here, a spike frequency varies according to magnitude of the received current signal. For example, if the current signal is large, a spike more frequently occurs. Between two gates, for example, the driving gate 170 and the control gate 180, the driving gate 170 receives an inhibitory signal and inhibits activity of a neuron if necessary and the control gate 180 maintains homeostasis of the neuron by adjusting a voltage to be applied and thereby adjusting a firing threshold voltage if necessary.

Herein, a control device configured to determine whether a frequency for an output voltage in a form of a spike of a single transistor neuron is abnormal and to adjust a voltage to be applied to a control gate if the frequency is determined to be abnormal may be further included.

Figure 5A:
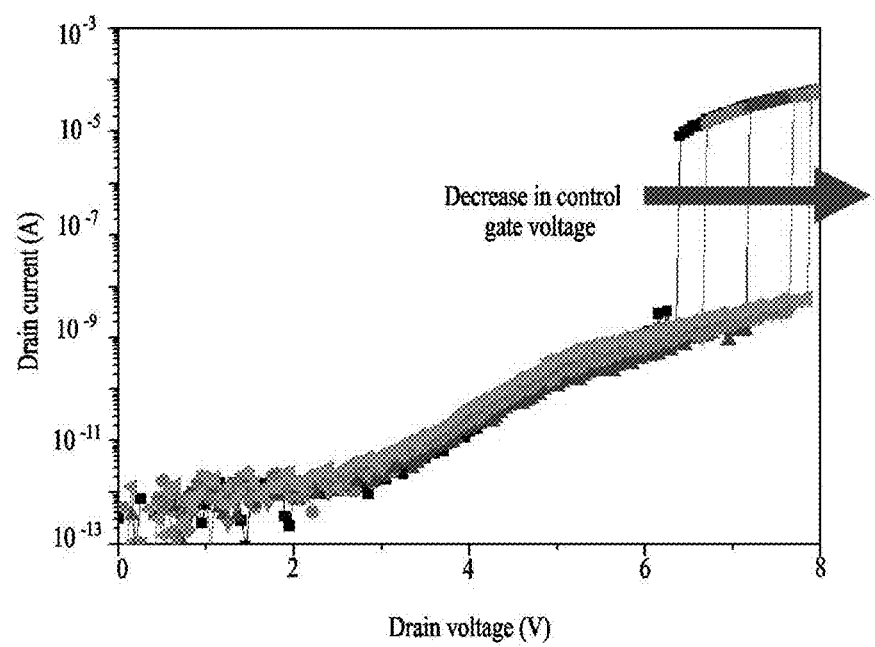
FIGS. 5A and 5B are examples of result graphs based on a basic neuron characteristic of a single transistor neuron with a double gate structure according to an example embodiment.
Figure 5B:
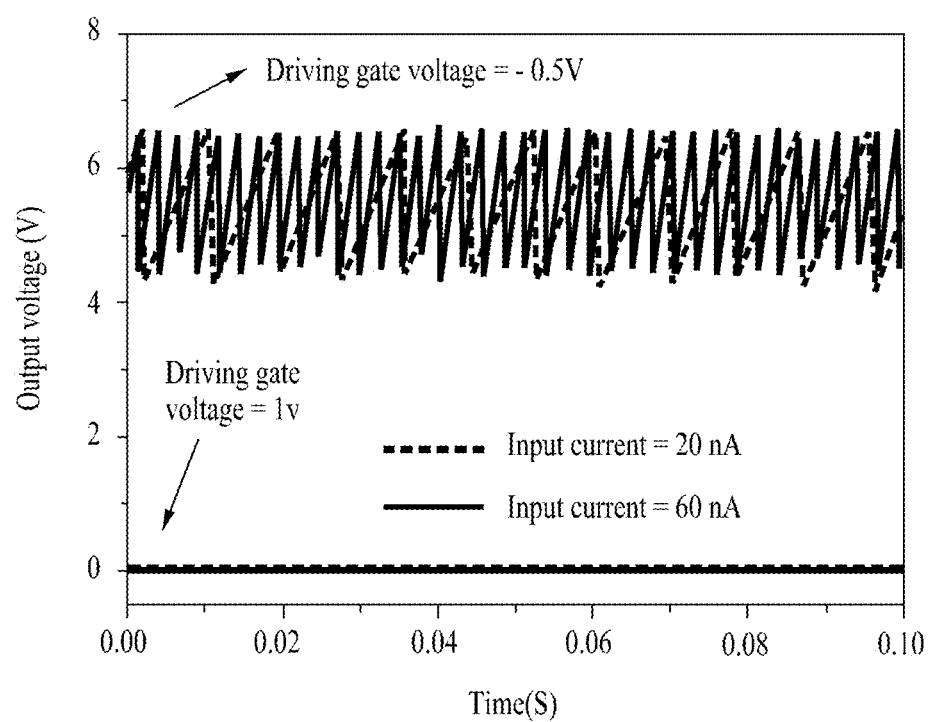

FIGS. 5A and 5B are examples of result graphs based on a basic neuron characteristic of a single transistor neuron with a double gate structure according to an example embodiment. FIG. 5A is a graph showing results of specifying a drain current according to a drain voltage of the single transistor neuron with the double gate structure and FIG. 5B is a graph showing results of implementing a spiking operation of a neuron using a phenomenon of FIG. 5A.

Referring to FIG. 5A, in the case of applying a predetermined drain voltage or more to the single transistor, a large current instantaneously flows due to a single transistor latch phenomenon. When no current flows and then suddenly large current flows, it represents that a firing action of a neuron is possible. Also, it can be known that a firing threshold voltage of a neuron is adjustable through a control gate in that a drain voltage, that is, a latch voltage allowing a large current to flow varies according to a change in a voltage of the control gate.

Also, referring to FIG. 5B, a typical neuron characteristic can be verified that an output voltage over time appears in a form of a spike in response to an input of a constant current and a spiking frequency increases according to an increase in an input current value increases. Here, in the case of applying a specific voltage to a driving gate, an inhibitory function of inhibiting a spiking action of a neuron although a current is input.

Figure 6A:
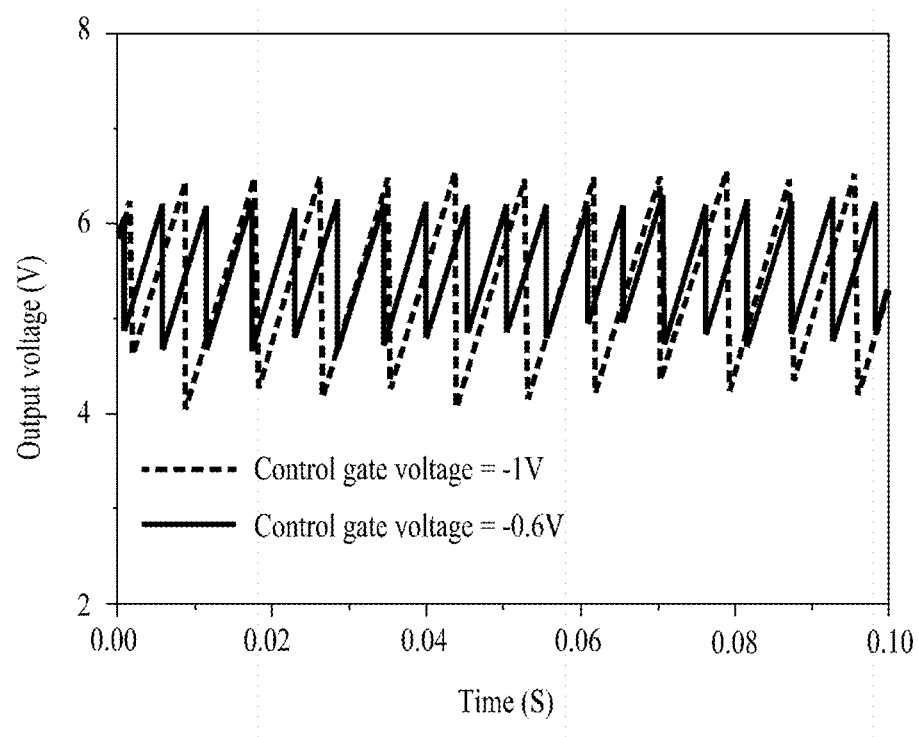
FIGS. 6A, 6B, and 6C are examples of result graphs based on a firing threshold voltage adjusting function of a single transistor neuron with a double gate structure according to an example embodiment.
Figure 6B:
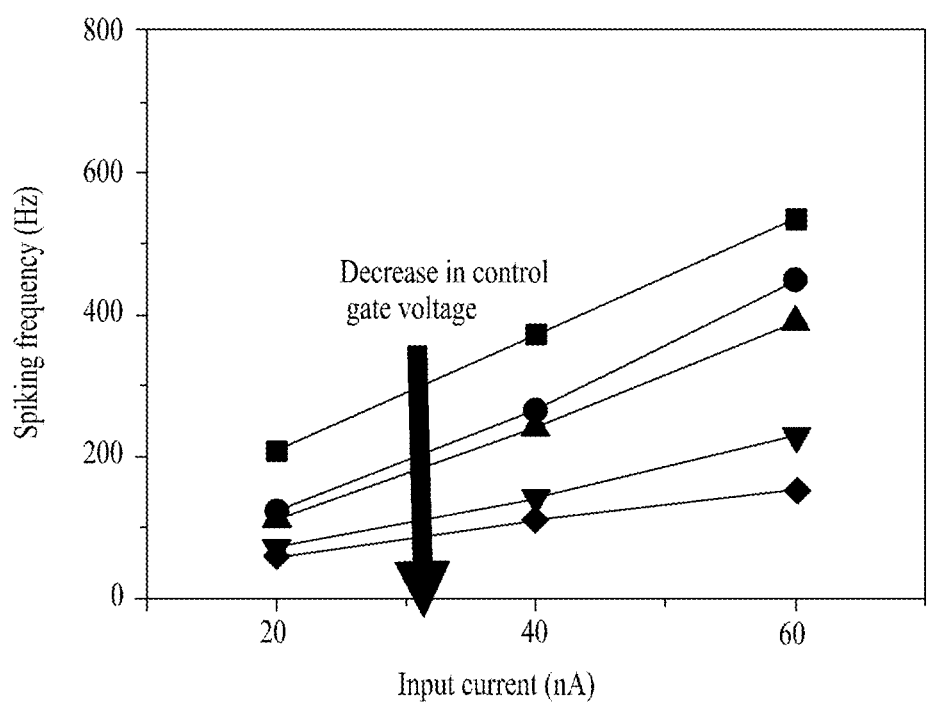
Figure 6C:
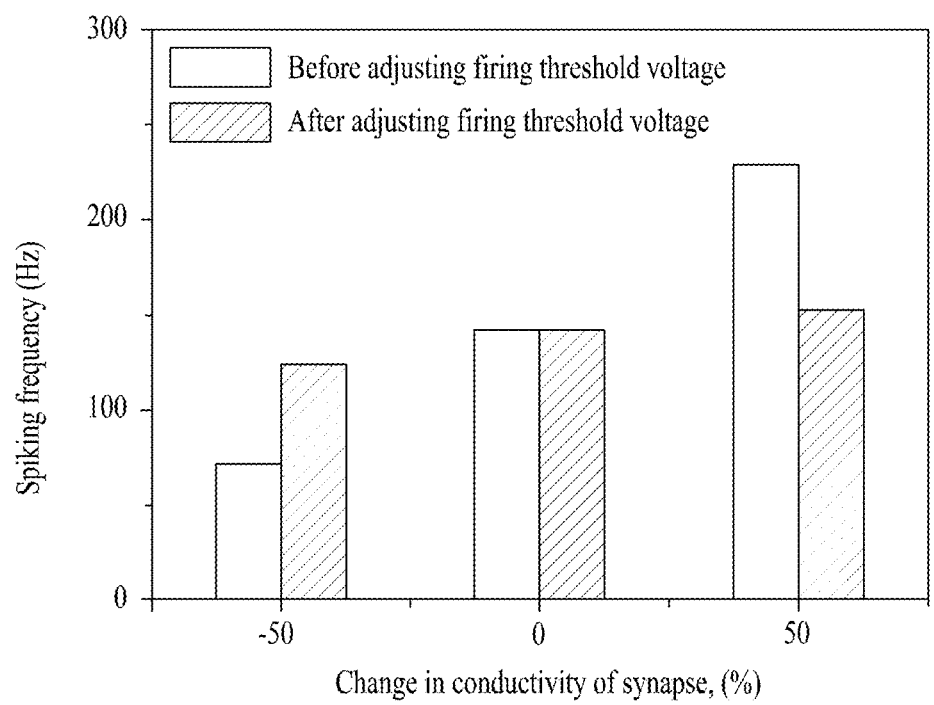

FIGS. 6A, 6B, and 6C are examples of result graphs based on a firing threshold voltage control function of a single transistor neuron with a double gate structure according to an example embodiment.

FIG. 6A is a graph showing results of measuring a spike action according to a control gate voltage. Referring to FIG.

6A, if the same current is input, a firing threshold voltage and a spiking frequency vary according to a change in a control gate voltage.

FIG. 6B is a graph showing a spiking frequency according to an input current for each control gate voltage. Referring to FIG. 6B, a typical neuron characteristic can be verified that a spiking frequency increases according to an increase in an input current over the entire control gate voltage. Also, it can be seen that a spiking frequency decreases according to a decrease in a control gate voltage since if the control gate voltage decreases, a latch voltage increases and a firing threshold voltage increases accordingly.

FIG. 6C illustrates an example of implementing a homeostasis function of a neuron based on an aspect that a spiking frequency varies as a control gate voltage varies as illustrated in FIG. 6B. Referring to FIG. 6C, as a conductivity of a synapse connected to a neuron decreases or increases, a spiking frequency decreases or increases at the same ratio. Meanwhile, in the case of adjusting a firing threshold voltage according to a control gate voltage when such an abnormal spiking frequency is output, it is possible to constantly maintain the spiking frequency. Accordingly, it is possible to implement a homeostasis of a neuron and to enhance stability of a neuromorphic system.

Experiments of FIGS. 5A, 5B, 6A, 6B, and 6C were directly performed in a single transistor manufactured with a gate length of 500 nm, with a floating body layer width of 700 nm, and a floating body layer of 50 nm.

A single transistor neuron with a double gate structure for an adjustable firing threshold voltage and an operation method thereof according to an example embodiment may implement a neuron configured as a complex circuit on an existing neuromorphic chip as a single device and may maintain homeostasis of the neuron from external instability by adjusting a firing threshold voltage of the neuron as necessary.

Also, a single transistor neuron and an operation method thereof according to an example embodiment may store charge in a transistor and thus, does not require an external capacitor. Also, if an amount of stored charge reaches a predetermined threshold or more, the stored charge is automatically removed. Therefore, an existing comparator circuit or a potential adjusting circuit of is not required. Accordingly, it is possible to significantly enhance the degree of integration of a neuron on a neuromorphic chip.

Also, a single transistor neuron with a double gate structure according to an example embodiment enables a driving gate between two gates, for example, the driving gate and a control gate to receive an inhibitory signal from a synapse or another neuron and to inhibit an action of the neuron. The corresponding inhibitory function may fire only a necessary neuron and thus, may reduce power consumption of a neuromorphic system.

Also, a single transistor neuron with a double gate structure according to an example embodiment enables a control gate between two gates, for example, the driving gate and a control gate to adjust a firing threshold voltage of a neuron and to maintain homeostasis of the neuron from a plurality of factors.

Further, the example embodiments may implement a neuromorphic system using the aforementioned single transistor neuron. The neuromorphic system may include a neuromorphic chip using the single transistor neuron with the double gate structure for an adjustable firing threshold voltage.

Here, the neuromorphic system may include any one synaptic device among a resistive random access memory (RRAM), a memristor, a charge trap flash memory, a phase change material (PCM), and a ferroelectric RAM (FeRAM).

Here, the neuromorphic chip may include at least one additional component among a resistance, a capacitor, another transistor, and an inverter in a limited area.

While this disclosure includes specific example embodiments, it will be apparent to one of ordinary skill in the art that various alterations and modifications in form and details may be made in these example embodiments without departing from the spirit and scope of the claims and their equivalents. For example, suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A single transistor neuron with a double gate structure, the single transistor neuron comprising:
   a barrier material layer formed on a semiconductor substrate and comprising a hole barrier material or an electron barrier material;
   a floating body layer formed on the barrier material layer, the floating body layer having first, second, third, and fourth sides;
   a source and a drain formed at the third and fourth sides of the floating body layer, respectively;
   a driving gate formed at the first side of the floating body layer without contacting the source and the drain;
   a control gate formed at the second side of the floating body layer without contacting the source and the drain; and
   a gate insulating film formed between the floating body layer and the driving gate and between the floating body layer and the control gate, wherein the single transistor neuron with the double gate structure integrates a signal when a current signal is applied to the source or the drain and outputs a voltage signal in a form of a spike from the source or the drain if the integrated signal reaches a predetermined level or more.

2. The single transistor neuron of claim 1, wherein the barrier material layer is formed using one of buried oxide, a buried n-well in the case of a p-type body, a buried p-well in the case of an n-type body, buried SiC, and buried SiGe.

3. The single transistor neuron of claim 1, wherein the floating body layer accumulates holes or electrons and is formed using one of silicon, germanium, silicon germanium, and a group III-V compound semiconductor.

4. The single transistor neuron of claim 1, wherein the semiconductor substrate is configured to act as a back gate.

5. The single transistor neuron of claim 1, wherein the source and the drain are formed using one of n-type silicon, p-type silicon, and metal silicide.

6. The single transistor neuron of claim 5, wherein the source and the drain formed using the n-type silicon or the p-type silicon are formed using at least one of diffusion, solid-phase diffusion, epitaxial growth, selective epitaxial growth, ion implantation, and subsequent annealing treatment.

7. The single transistor neuron of claim 5, wherein the source and the drain formed using the metal silicide comprises the metal silicide formed using one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), lead (Pb), and iridium (Ir), and enhances a junction using dopant segregation.

8. The single transistor neuron of claim 1, wherein the driving gate and the control gate are formed using one of n-type polysilicon, p-type polysilicon, aluminum (Al), molybdenum (Mo), chromium (Cr), palladium (Pd), platinum (Pt), nickel (Ni), titanium (Ti), tantalum (Ta), tungsten (W), silver (Ag), titanium nitride (TiN), tantalum nitride (TaN), and any combination thereof.

9. The single transistor neuron of claim 1, wherein the gate insulating film is formed using one of silicon oxide, silicon nitride, silicon oxynitride, aluminum oxide, hafnium oxide, hafnium oxynitride, zinc oxide, zirconium oxide, hafnium zirconium oxide (HZO), and any combination thereof.

10. The single transistor neuron of claim 1, wherein the driving gate and the control gate are independently separate from each other and formable into different types, and the gate insulating film in contact with the driving gate and the gate insulating film in contact with the control gate are formable using different types, electric constants, and thicknesses.

11. The single transistor neuron of claim 1, wherein the single transistor neuron with the double gate structure implements an inhibitory function of inhibiting a spike action of a neuron by inputting an inhibitory signal to the driving gate.

12. The single transistor neuron of claim 1, wherein the single transistor neuron with the double gate structure maintains homeostasis of a neuron by changing a voltage that is applied to the control gate and thereby adjusting a firing threshold voltage of the neuron.

13. An operation method of a single transistor neuron with a double gate structure comprising a driving gate and a control gate independently separate from each other, the method comprising:
    inputting a current signal from a previous synaptic device to a source or a drain;
    storing charge by the current signal in a transistor;
    outputting a voltage signal in a form of a spike when a source voltage or a drain voltage increasing according to the stored charge reaches a firing threshold voltage or more; and
    adjusting the firing threshold voltage through the control gate if a frequency of the output voltage signal deviates from a preset normal range,
    wherein the single transistor neuron with the double gate structure integrates a signal when a current signal is applied to the source or the drain and outputs a voltage signal in a form of a spike from the source or the drain if the integrated signal reaches a predetermined level or more.

14. A neuromorphic system comprising a single transistor neuron with a double gate structure comprising a driving gate and a control gate independently separate from each other, wherein the single transistor neuron is capable of adjusting a firing threshold voltage through the control gate and wherein the single transistor neuron with the double gate structure integrates a signal when a current signal is applied to the source or the drain and outputs a voltage signal in a form of a spike from the source or the drain if the integrated signal reaches a predetermined level or more.

15. The neuromorphic system of claim 14, wherein the neuromorphic system comprises at least one additional component among a resistance, a capacitor, another transistor, and an inverter in addition to the single transistor neuron.

16. The neuromorphic system of claim 14, wherein the neuromorphic system comprises any one synaptic device among a resistive random-access memory (RRAM), a memristor, a charge trap flash memory, a phase change material (PCM), and a ferroelectric RAM (FeRAM) in addition to the single transistor neuron.

17. A single transistor neuron with a double gate structure, the single transistor neuron comprising:
    a barrier material layer formed on a semiconductor substrate and comprising a hole barrier material or an electron barrier material;
    a floating body layer formed on the barrier material layer, the floating body layer having first, second, third, and fourth sides;
    a source and a drain formed at the third and fourth sides of the floating body layer, respectively;
    a driving gate formed at the first side of the floating body layer without contacting the source and the drain;
    a control gate formed at the second side of the floating body layer without contacting the source and the drain; and
    a gate insulating film formed between the floating body layer and the driving gate and between the floating body layer and the control gate,
    wherein the single transistor neuron with the double gate structure implements an inhibitory function of inhibiting a spike action of a neuron by inputting an inhibitory signal to the driving gate, integrates the signal when a current signal is applied to the source or drain, and outputs a voltage signal in the form of a spike from the source or drain when the integrated signal reaches a predetermined level or higher.

* * * * *